United States Patent
Lavoie et al.

(10) Patent No.: US 9,754,935 B2
(45) Date of Patent: Sep. 5, 2017

(54) RAISED METAL SEMICONDUCTOR ALLOY FOR SELF-ALIGNED MIDDLE-OF-LINE CONTACT

(71) Applicant: INTERNATIONAL BUSINESS MACHINES CORPORATION, Armonk, NY (US)

(72) Inventors: Christian Lavoie, Pleasantville, NY (US); Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 72 days.

(21) Appl. No.: 14/453,751

(22) Filed: Aug. 7, 2014

(65) Prior Publication Data
US 2016/0043075 A1 Feb. 11, 2016

(51) Int. Cl.
*H01L 27/088* (2006.01)
*H01L 21/336* (2006.01)
(Continued)

(52) U.S. Cl.
CPC ...... *H01L 27/088* (2013.01); *H01L 21/28518* (2013.01); *H01L 21/76897* (2013.01);
(Continued)

(58) Field of Classification Search
CPC ............ H01L 27/088; H01L 21/32053; H01L 21/76886; H01L 21/76897;
(Continued)

(56) References Cited

U.S. PATENT DOCUMENTS

| 4,954,855 A | 9/1990 | Mimura et al. |
| 6,890,823 B2 * | 5/2005 | Lee ................... H01L 21/76889 |
| | | 257/408 |

(Continued)

FOREIGN PATENT DOCUMENTS

| CN | 103000675 A | 3/2013 |
| JP | 61231765 A | 10/1986 |

(Continued)

*Primary Examiner* — Marcos D Pizarro Crespo
*Assistant Examiner* — Nelson Garces
(74) *Attorney, Agent, or Firm* — Scully, Scott, Murphy & Presser, P.C.; Louis J. Percello, Esq.

(57) ABSTRACT

A method to form self-aligned middle-of-line (MOL) contacts between functional gate structures without the need of lithographic patterning and etching by using raised metal semiconductor alloy regions is provided. Raised metal semiconductor alloy regions are formed by reacting a metal layer with a semiconductor material in raised semiconductor material regions formed on portions of at least one active region of a substrate located between functional gate structures. The metal layer includes a metal capable of forming a metal semiconductor alloy with a large volume expansion such that the resulting metal semiconductor alloy regions can be raised to a same height as that of the functional gate structures. As a result, no lithographic patterning and etching between functional gate structures are needed when forming MOL contacts to these raised metal semiconductor alloy regions.

11 Claims, 15 Drawing Sheets

(51) Int. Cl.

| | | |
|---|---|---|
| *H01L 29/78* | (2006.01) | |
| *H01L 21/4763* | (2006.01) | |
| *H01L 29/66* | (2006.01) | |
| *H01L 29/417* | (2006.01) | |
| *H01L 21/768* | (2006.01) | |
| *H01L 29/08* | (2006.01) | |
| *H01L 21/285* | (2006.01) | |
| *H01L 21/8234* | (2006.01) | |
| *H01L 29/165* | (2006.01) | |
| *H01L 23/485* | (2006.01) | |
| *H01L 23/532* | (2006.01) | |

(52) U.S. Cl.
CPC .. *H01L 21/823425* (2013.01); *H01L 29/0847* (2013.01); *H01L 29/41783* (2013.01); *H01L 29/665* (2013.01); *H01L 29/66545* (2013.01); *H01L 29/66628* (2013.01); *H01L 21/28525* (2013.01); *H01L 23/485* (2013.01); *H01L 23/53271* (2013.01); *H01L 29/165* (2013.01); *H01L 2924/0002* (2013.01)

(58) Field of Classification Search
CPC ............. H01L 29/41783; H01L 29/665; H01L 29/66545; H01L 21/823425; H01L 21/28518; H01L 29/66628; H01L 29/0847; H01L 2924/0002; H01L 23/53271; H01L 23/485; H01L 21/28525
USPC .................................. 257/259–269
See application file for complete search history.

(56) References Cited

U.S. PATENT DOCUMENTS

| | | | |
|---|---|---|---|
| 7,466,010 B2 | 12/2008 | Ahlgren et al. | |
| 8,349,718 B2 | 1/2013 | Uozumi | |
| 8,405,131 B2 | 3/2013 | Yang | |
| 2009/0017563 A1* | 1/2009 | Jiang ................... | H01L 21/3105 438/4 |
| 2009/0206449 A1* | 8/2009 | Cooney, III ...... | H01L 21/76224 257/593 |
| 2012/0068237 A1* | 3/2012 | Booth, Jr. .............. | H01L 21/84 257/296 |
| 2012/0211808 A1* | 8/2012 | Wei .................. | H01L 21/823412 257/288 |
| 2012/0211837 A1* | 8/2012 | Baars .............. | H01L 21/823475 257/368 |
| 2013/0059434 A1 | 3/2013 | Yang et al. | |
| 2013/0062669 A1 | 3/2013 | Chen et al. | |
| 2013/0065371 A1* | 3/2013 | Wei ................... | H01L 21/76224 438/294 |
| 2013/0092988 A1 | 4/2013 | Uozumi | |
| 2013/0175596 A1* | 7/2013 | Cheng ................. | H01L 27/0629 257/310 |
| 2013/0295734 A1* | 11/2013 | Niebojewski ..... | H01L 29/66477 438/197 |
| 2015/0263169 A1* | 9/2015 | Gu ...................... | H01L 29/7843 257/635 |

FOREIGN PATENT DOCUMENTS

| | | |
|---|---|---|
| JP | 1842651 C | 5/1994 |
| JP | 09162397 A | 6/1997 |

* cited by examiner

RAISED METAL SEMICONDUCTOR ALLOY FOR SELF-ALIGNED MIDDLE-OF-LINE CONTACT

BACKGROUND

The present application relates to semiconductor device fabrication, and more particularly, to a method of forming self-aligned middle-of-line (MOL) contacts using a raised metal semiconductor alloy.

Field Effect Transistors (FETs) are essential components of all modern electronic products. Generally, and after a transistor is formed, electrical contacts are made to connect a source region, a drain region, and/or a gate region of the transistor to make the transistor fully functional. In a conventional electrical contact forming process, contact via holes are typically formed using photolithographic patterning and etching. With the continuous scaling of device dimension in integrated circuits, the gate-to-gate pitch is getting so narrow that forming contact via holes between two gates using direct patterning becomes very challenging. Moreover, as the associated metal interconnection line patterns are miniaturized, the aspect ratio of via holes increases which makes completely filling via holes with a low resistance metal, such as tungsten (W), very difficult. Therefore, there remains a need to develop a method to form MOL contacts without the need of using photolithographic patterning and etching processes.

SUMMARY

The present application provides a method to form self-aligned middle-of-line (MOL) contacts between functional gate structures without the need of lithographic patterning and etching by using a raised metal semiconductor alloy. Raised metal semiconductor alloy regions are formed by reacting a metal layer with a semiconductor material in raised source/drain regions formed on portions of at least one active region of a substrate located between functional gate structures. The metal layer includes a metal capable of forming a metal semiconductor alloy with a large volume expansion such that the resulting metal semiconductor alloy regions can be raised to a same height as that of the functional gate structures. As a result, no lithographic patterning and etching between functional gate structures are needed when forming MOL contacts to these raised metal semiconductor alloy regions.

In one aspect of the present application, a semiconductor structure is provided. The semiconductor structure includes a plurality of functional gate structures located over at least one active region of a substrate, a plurality of planar source/drain regions, a plurality of raised source/drain regions and a plurality of metal semiconductor alloy regions. Each of the plurality of planar source/drain regions is present in a portion of the at least one active region located between adjacent functional gate structures of the plurality of functional gate structures, each of the plurality of raised source/drain regions overlies a corresponding planar source/drain region of the plurality of planar source/drain regions, and each of the plurality of metal semiconductor alloy regions overlies a corresponding raised source/drain region of the plurality of raised source/drain regions and has a top surface substantially coplanar with topmost surfaces of the plurality of functional gate structures.

In another aspect of the present application, a method of forming a semiconductor structure is provided. The method includes first forming a plurality of sacrificial gate structures over at least one active region of a substrate. A gate spacer is then formed on each sidewall of the plurality of sacrificial gate structures. After forming a plurality of raised semiconductor material regions over portions of the at least one active region between adjacent sacrificial gate structures of the plurality of sacrificial gate structures, an interlevel dielectric (ILD) layer is formed over the substrate. The ILD layer covers the plurality of raised semiconductor material regions and has a top surface coplanar with topmost surfaces of the plurality of sacrificial gate structures. Next, each of the plurality of sacrificial gate structures is replaced with a functional gate structure to provide a plurality of functional gate structures. After recessing the ILD layer to expose the plurality of raised semiconductor material regions, a metal layer is formed over the substrate to cover the plurality of raised semiconductor material regions. The metal layer has a top surface located above topmost surfaces of the plurality of functional gate structures. Next, a metal semiconductor alloy region is formed on each of remaining portions of the plurality of raised semiconductor material regions to provide a plurality of metal semiconductor alloy regions. The plurality of metal semiconductor alloy region has top surfaces substantially coplanar with the topmost surfaces of the plurality of functional gate structures.

DETAILED DESCRIPTION

Figure 1A:
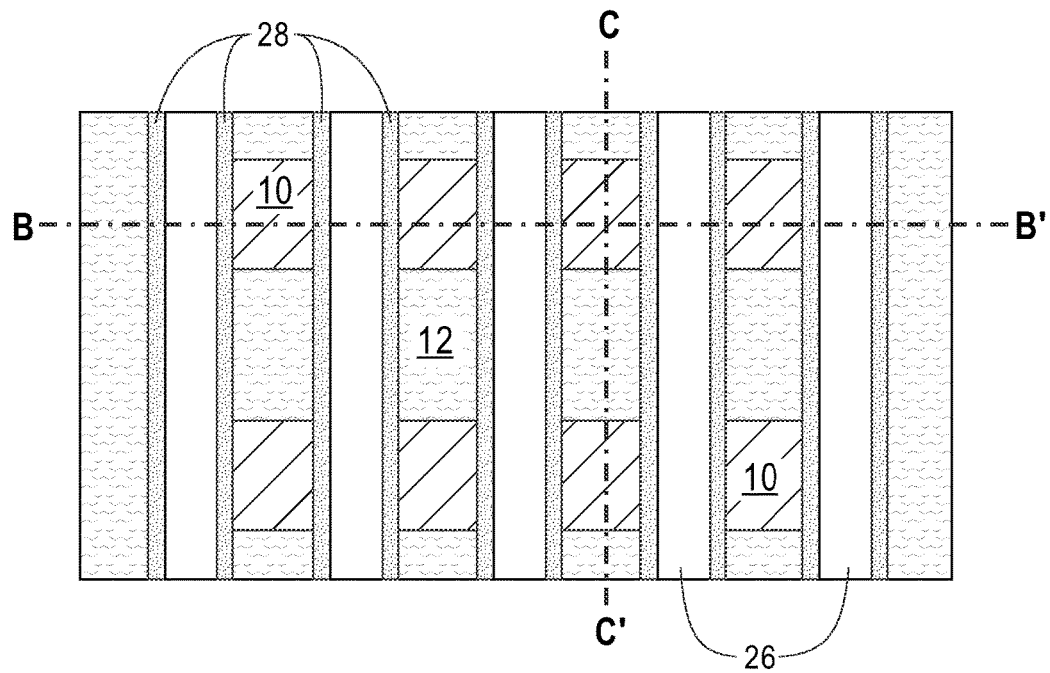
FIG. 1A is a top-down view of an exemplary semiconductor structure including a semiconductor substrate and sacrificial gate structures formed thereon in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form raised metal semiconductor alloy regions as self-aligned MOL contacts in a gate-last processing flow for planar FETs, the basic concept of the present application can also be used in a gate-first processing flow. Furthermore, the basic concept of the present application can be applied to form raised metal semiconductor alloy regions as self-aligned MOL contacts in non-planar devices such as FinFETs and nanowire FETs as well.

Figure 1B:
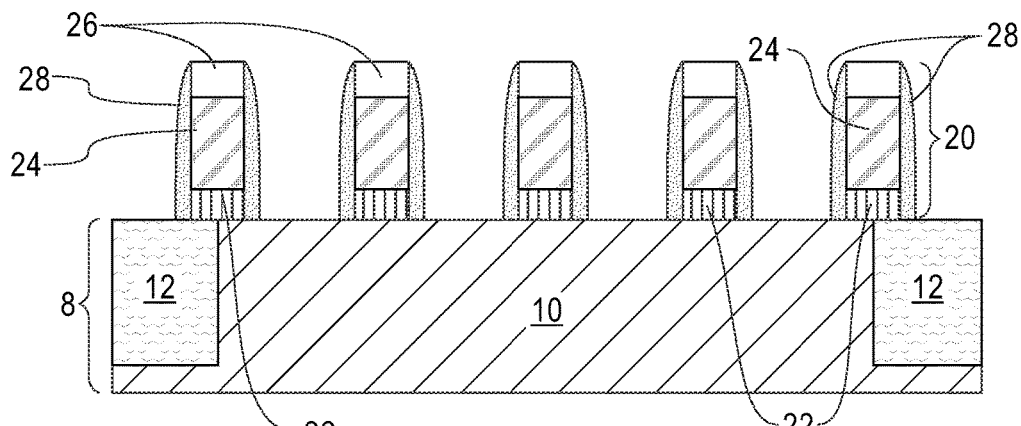
FIG. 1B is a cross-sectional view of the exemplary semiconductor structure of FIG. 1A along line B-B'.
Figure 1C:
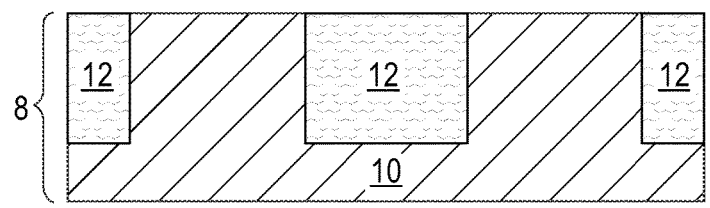
FIG. 1C is a cross-sectional view of the exemplary semiconductor structure of FIG. 1A along line C-C'.

Referring to FIGS. 1A-1C, an exemplary semiconductor structure according to an embodiment of the present application includes a semiconductor substrate 8. In one embodiment and as shown in FIGS. 1A-1C, the semiconductor substrate 8 can be a bulk semiconductor substrate including active regions 10 defined by shallow trench isolation (STI) regions 12. The active regions 10 can be composed of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the active regions 10 may comprise a single crystalline semiconductor material, such as, for example, single crystalline silicon. In other embodiments, the active regions 10 may comprise a polycrystalline or amorphous semiconductor material. Alternatively, the semiconductor substrate 8 can be a semiconductor-on-insulator (SOI) substrate including a stack, from bottom to top, of a handle substrate (not shown), a buried insulator layer (not shown) and a top semiconductor layer that includes active regions 10 and STI regions 12. P-type dopants and/or n-type dopants can be implanted into the active regions 10. Examples of p-type dopants include, but are not limited to, boron, aluminum, gallium and indium. Examples of n-type dopants include, but are not limited to, antimony, arsenic and phosphorous.

The STI regions 12 can be formed utilizing a conventional trench isolation process well known to those skilled in the art. For example, lithography, etching and filling of the trench with a trench dielectric such as an oxide may be used in forming the STI regions. Optionally, a liner may be formed in the trench prior to trench fill, a densification step may be performed after the trench fill and a planarization process may follow the trench fill as well.

A plurality of sacrificial gate structures 20 are formed on the semiconductor substrate 8, i.e., on top surfaces of the active regions 10. Each of the sacrificial gate structures 20 may be composed of a sacrificial gate dielectric 22, a sacrificial gate conductor 24 and a sacrificial gate cap 26.

The sacrificial gate structures 20 can be formed by first providing a material stack of sacrificial gate level layers over the uppermost surface of the semiconductor substrate as blanket layers, i.e., as unpatterned contiguous layers (not shown). The sacrificial gate level layers can include, for example, from bottom to top, a sacrificial gate dielectric layer, a sacrificial gate conductor layer and a sacrificial gate cap layer. In some embodiments of the present application, the sacrificial gate dielectric layer can be omitted. When present, the sacrificial gate dielectric layer includes a dielectric material such as a semiconductor oxide or a semiconductor nitride. In one embodiment, the sacrificial gate dielectric layer can be a layer of silicon oxide, silicon nitride, or silicon oxynitride. The thickness of the sacrificial gate dielectric layer can be from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The thickness of the sacrificial gate conductor layer can be from 20 nm to 300 nm, although lesser and greater thicknesses can also be employed.

The sacrificial gate cap layer can be, for example, a silicon nitride layer or a silicon oxide layer. The thickness of the sacrificial gate cap layer can be from 50 nm to 300 nm, although lesser and greater thicknesses can also be employed.

The sacrificial gate level layers are then lithographically patterned to form sacrificial gate structures 20. Specifically, a photoresist (not shown) is applied over the topmost surface of the sacrificial gate level layers and is lithographically patterned by lithographic exposure and development. The pattern in the photoresist is transferred into the sacrificial gate level layers by an etch, which can be an anisotropic etch such as a reactive ion etch (RIE). The remaining portions of the sacrificial gate level layers after the pattern transfer constitute sacrificial gate structures 20.

A gate spacer 28 is formed on each sidewall of the sacrificial gate structures 20. The gate spacer 28 includes a dielectric material such as silicon oxide, silicon nitride, or silicon oxynitride. The gate spacer 28 can be formed by first providing a conformal gate spacer material layer (not shown) on exposed surfaces of the sacrificial gate structures 20 and the semiconductor substrate 8 and then etching the conformal gate spacer material layer to remove horizontal portions of the conformal gate spacer material layer. The conformal gate spacer material layer can be provided by a deposition process including, for example, chemical vapor deposition (CVD), plasma enhanced chemical vapor deposition (PECVD), or physical vapor deposition (PVD). The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

Figure 2A:
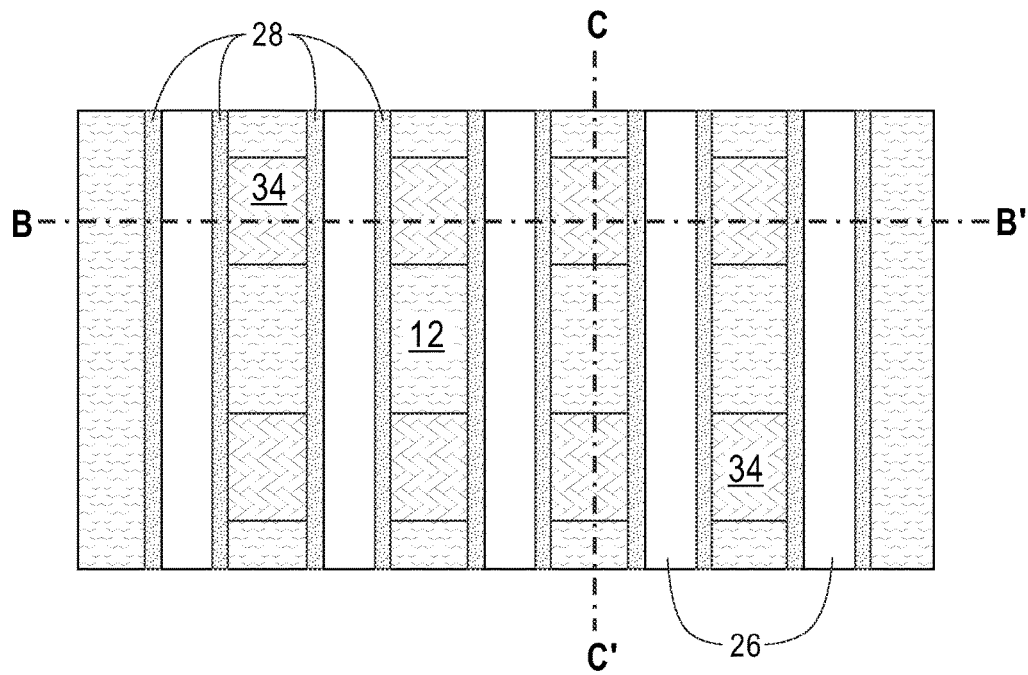
FIG. 2A is a top-down view of the exemplary semiconductor structure of FIG. 1A after forming raised source/drain regions between the sacrificial gate structures.
Figure 2B:
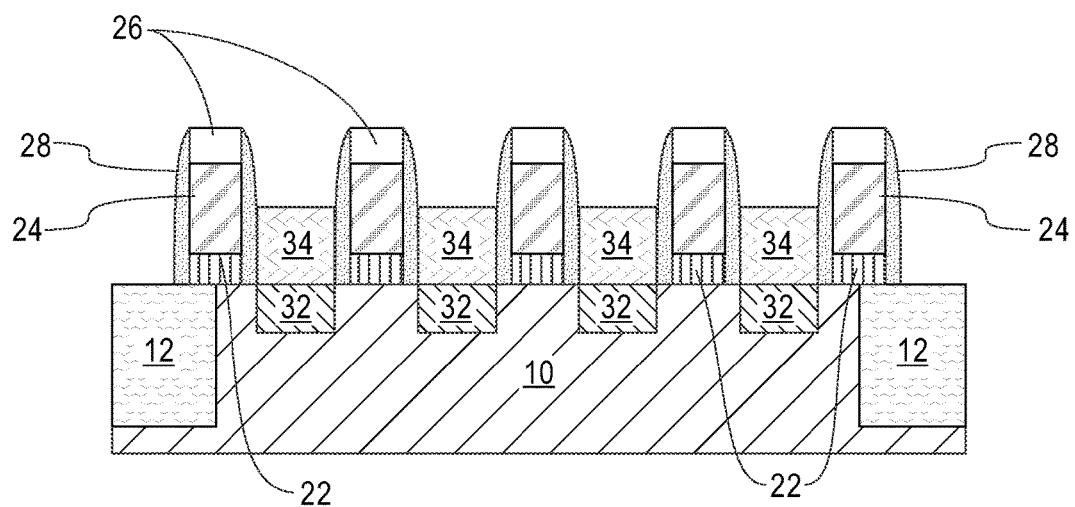
FIG. 2B is a cross-sectional view of the exemplary semiconductor structure of FIG. 2A along line B-B'
Figure 2C:
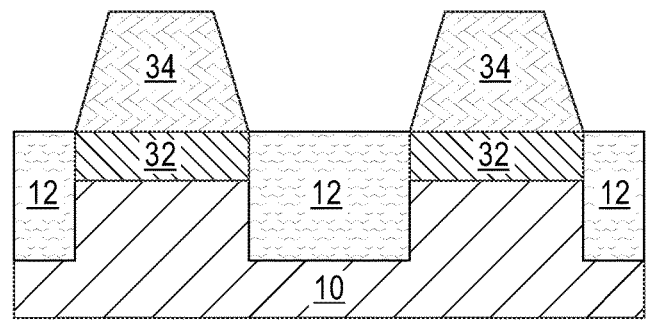
FIG. 2C is a cross-sectional view of the exemplary semiconductor structure of FIG. 2A along line C-C'

Referring to FIGS. 2A-2C, a source/drain implantation is performed to form planar source/drain regions 32 in portions of the active regions 10 between adjacent sacrificial gate structures 20. Each of the remaining portions of the active regions 10 that is located beneath a corresponding sacrificial gate structure 20 constitutes a body portion of a semiconductor device. The planar source/drain regions 32 can be formed by implanting dopants of the opposite conductivity type than the conductivity type of the active regions 10 using, for example, an ion implantation process, plasma doping, gas phase diffusion, or diffusion from a doped oxide. An activation anneal can be subsequently performed to activate the implanted dopants in the planar source/drain regions 32.

Raised semiconductor material regions 34 are then formed atop the planar source/drain regions 32, for example, by selective epitaxy. During the selective epitaxy process, the deposited semiconductor material grows only on exposed semiconductor regions, i.e., planar source/drain regions 32 and does not grow on dielectric surfaces, such as surfaces of the sacrificial gate cap 26, the gate spacer 28 and the STI regions 12. The selective epitaxy process may be continued until the raised semiconductor material regions 34 reaches a thickness ranging from 5 nm to 30 nm, as measured from the top surface of the planar source/drain regions 32, although lesser and greater thickness can also be employed.

In some embodiments of the present application, the raised semiconductor material regions 34 may be provided by epitaxially depositing a silicon-containing semiconductor material such as, for example, Si, SiGe and Si:C. The epitaxial growth of the silicon-containing semiconductor material can be effected by placing the semiconductor structure into a reaction chamber, and simultaneously, or alternately, flowing at least one silicon source reactant gas (such as $SiH_4$, $Si_2H_6$, $SiH_2Cl_2$, $GeH_4$, $C_2H_2$, $C_2H_4$) and an etchant gas (such as HCl) into the reaction chamber. Optionally, a carrier gas such as $H_2$, $N_2$, $H_2$, and/or Ar can be flowed into the reaction chamber. The temperature for epitaxial deposition typically ranges from 550° C. to 1300° C. The apparatus for performing the epitaxial growth may include a CVD apparatus, such as atmospheric pressure CVD (APCVD), low pressure CVD (LPCVD) and PECVD.

In other embodiments of the present application, the raised semiconductor material regions 34 may be provided by epitaxially depositing a germanium-containing semiconductor material. The epitaxial growth of the germanium-containing semiconductor material can be effected by placing the semiconductor structure into a reaction chamber and flowing a germanium-containing reactant gas into the reaction chamber. Exemplary germanium-containing reactant gases include $GeH_4$, $GeH_2Cl_2$, $GeCl_4$, and $Ge_2H_6$. The germanium-containing semiconductor material can be deposited by CVD, vacuum evaporation, or atomic layer deposition (ALD) at a temperature ranges from 450° C. to 900° C.

The semiconductor material (i.e., silicon-containing semiconductor material and germanium-containing semiconductor material) of the raised semiconductor material regions 34 can be deposited as an intrinsic semiconductor material, or can be deposited with in-situ doping. If the semiconductor material is deposited as an intrinsic semiconductor material, the raised semiconductor material regions 34 can be subsequently doped (ex-situ) utilizing ion implantation, gas phase doping or dopant out diffusion from a sacrificial dopant source material.

Figure 3A:
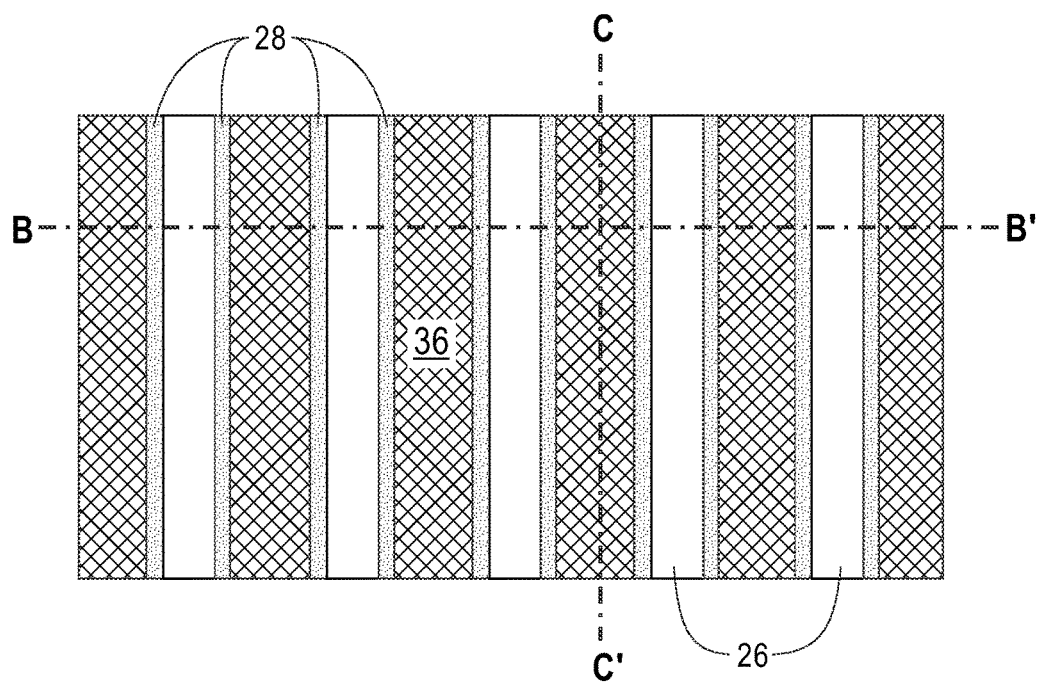
FIG. 3A is a top-down view of the exemplary semiconductor structure of FIG. 2A after forming an interlevel dielectric (ILD) layer over sacrificial gate structures, the raised source/drain regions and shallow trench isolation (STI) regions in the semiconductor substrate.
Figure 3B:
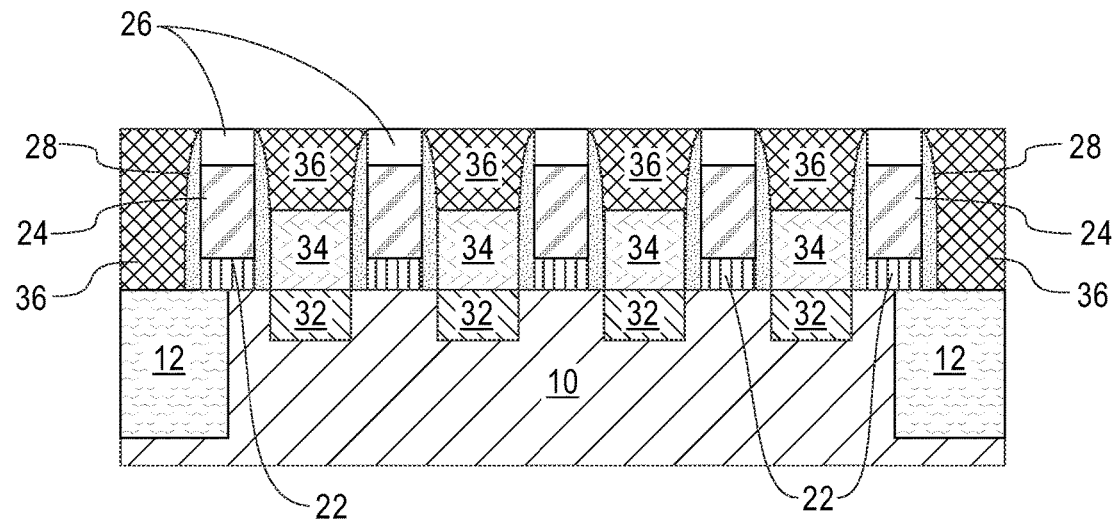
FIG. 3B is a cross-sectional view of the exemplary semiconductor structure of FIG. 3A along line B-B'.
Figure 3C:
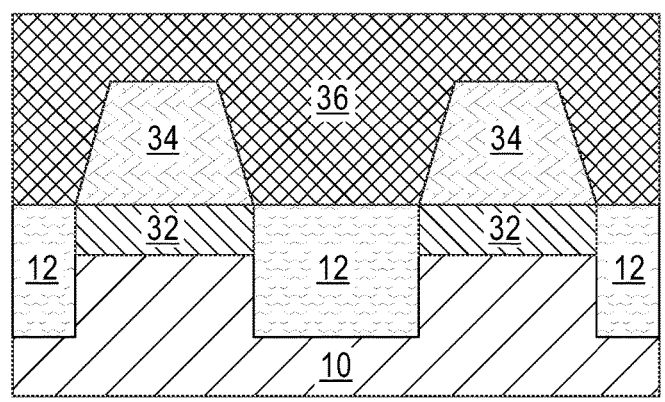
FIG. 3C is a cross-sectional view of the exemplary semiconductor structure of FIG. 3A along line C-C'.

Referring to FIGS. 3A-3C, an interlevel dielectric (ILD) layer 36 is formed over the sacrificial gate structures 20, the raised semiconductor material regions 34 and exposed portions of the STI regions 12. In some embodiments of the present application, the ILD layer 36 is composed of a dielectric material that may be easily planarized. For example, the ILD layer 36 can include a doped silicate glass, an undoped silicate glass (silicon oxide), an organosilicate glass (OSG), a porous dielectric material, or amorphous carbon. The ILD layer 36 can be deposited using a conventional deposition process, such as, for example, chemical vapor deposition (CVD), plasma enhanced CVD (PECVD), sputter deposition, reactive sputter deposition, ion-beam deposition, and evaporation. Following the deposition of the ILD layer 36, the ILD layer 36 can be subsequently planarized, for example, by CMP using a topmost surface of each sacrificial gate structure 20 as an etch stop so that a top surface of the ILD layer 30 is coplanar with the topmost surface of each sacrificial gate structure 20.

Figure 4A:
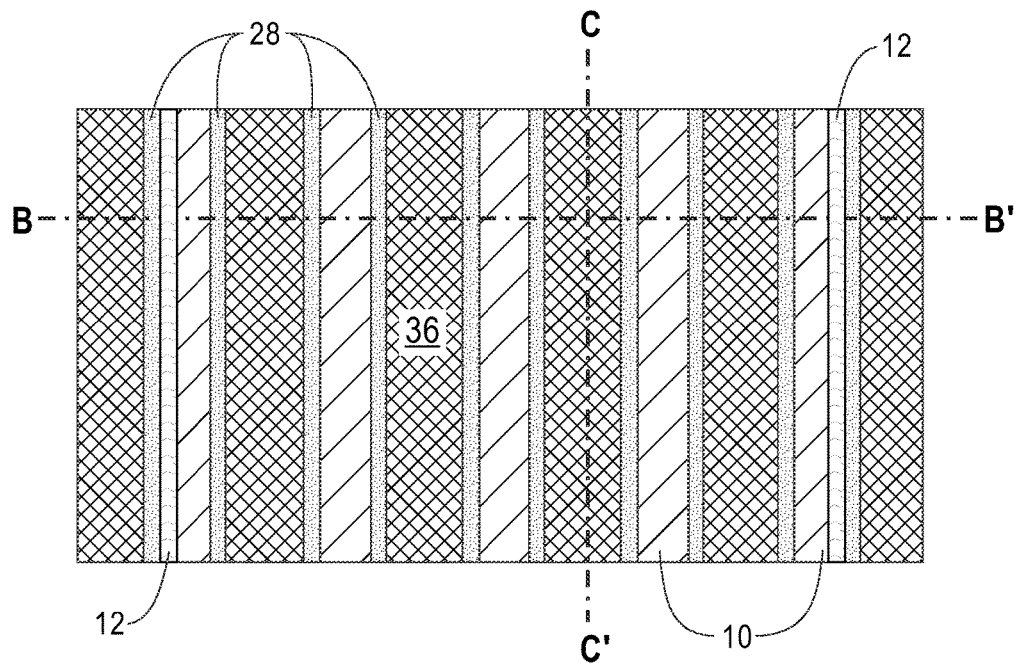
FIG. 4A is a top-down view of the exemplary semiconductor structure of FIG. 3A after removing the sacrificial gate structures to provide gate cavities.
Figure 4B:
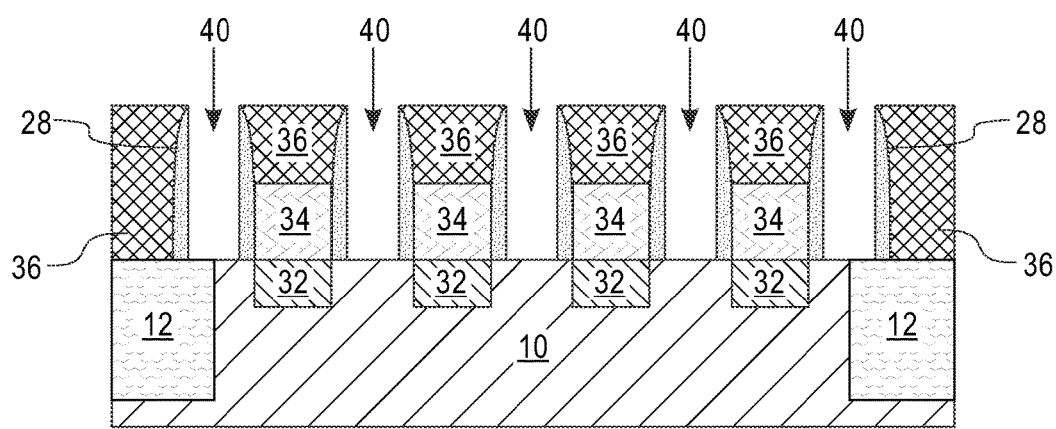
FIG. 4B is a cross-sectional view of the exemplary semiconductor structure of FIG. 4A along line B-B'.
Figure 4C:
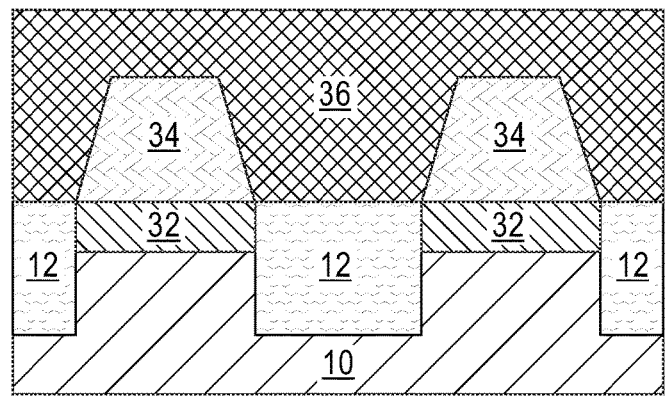
FIG. 4C is a cross-sectional view of the exemplary semiconductor structure of FIG. 4A along line C-C'.

Referring to FIGS. 4A-4C, the sacrificial gate structures 20 are removed to provide gate cavities 40. The sacrificial gate structures 20 can be removed selectively to the active regions 10, the STI regions 12, the gate spacer 26 and the ILD layer 36 using at least one etch. The at least on etch can be a wet chemical etch such as an ammonia etch or a dry etch such as RIE. A gate cavity 40 is thus formed within a volume from which each sacrificial gate structure 20 is removed and is laterally confined by inner sidewalls of the gate spacer 28.

Figure 5A:
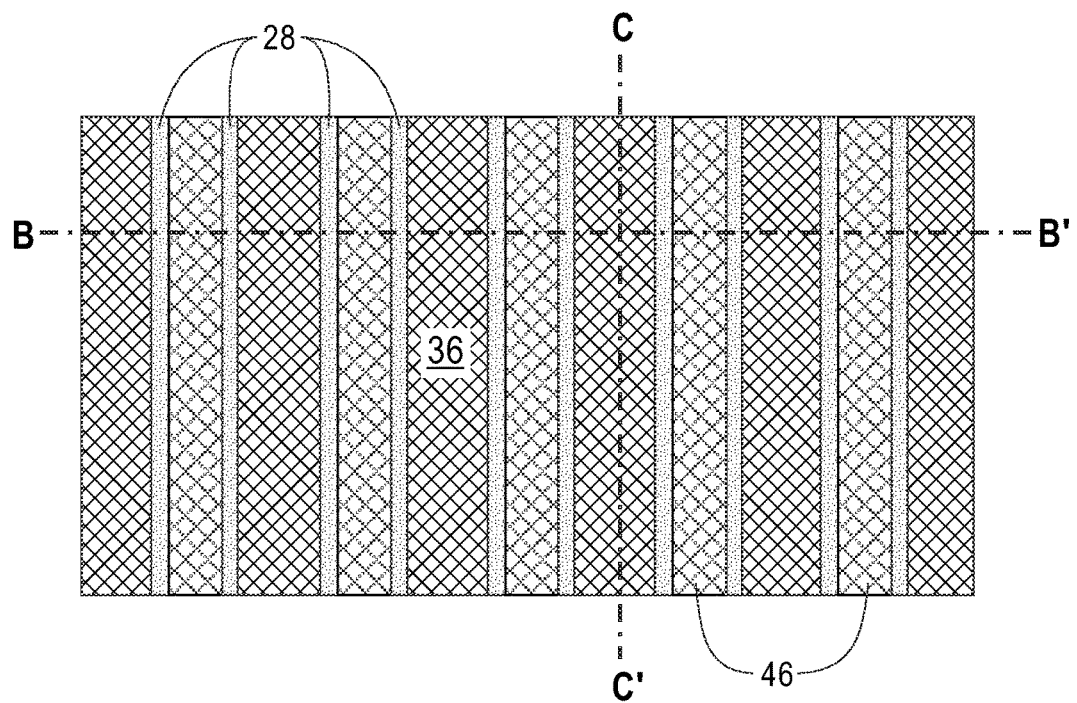
FIG. 5A is a top-down view of the exemplary semiconductor structure of FIG. 4A after forming functional gate structures in the gate cavities.
Figure 5B:
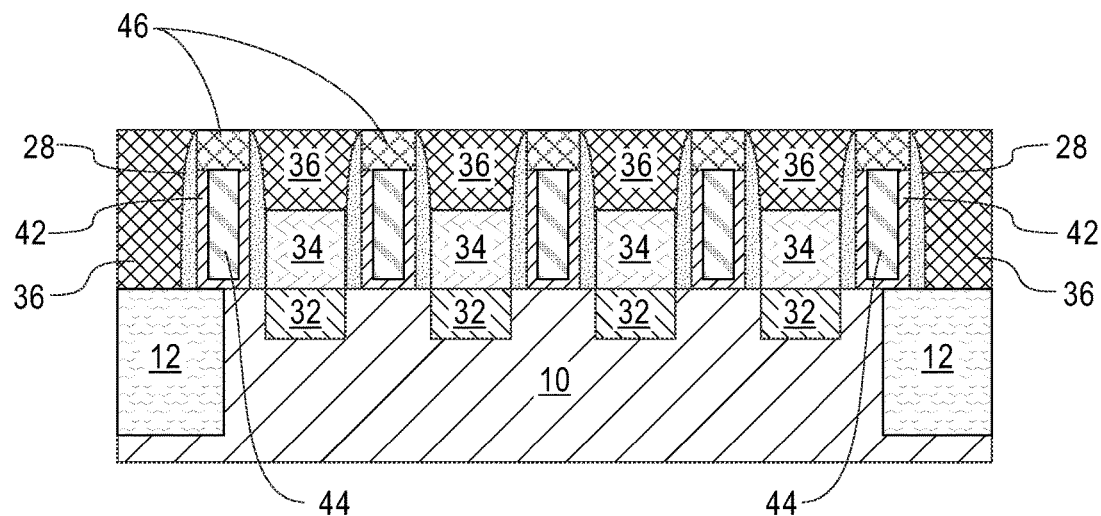
FIG. 5B is a cross-sectional view of the exemplary semiconductor structure of FIG. 5A along line B-B'.
Figure 5C:
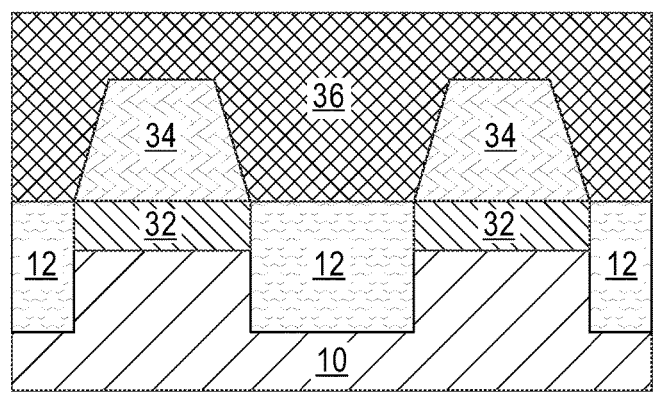
FIG. 5C is a cross-sectional view of the exemplary semiconductor structure of FIG. 5A along line C-C'.

Referring to FIGS. 5A-5C, functional gate structures (42, 44, 46) are formed in the gate cavities 40. Each functional gate structure (42, 44, 46) includes, from bottom to top, a gate dielectric 42, a gate electrode 44 and a gate cap 46. The functional gate structures (42, 44, 46) can be formed by first depositing a conformal gate dielectric layer (not shown) on bottom surfaces and sidewalls of the gate cavities 40 and the top surface of the ILD layer 36. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer is a hafnium oxide ($HfO_2$) layer. The gate dielectric layer can be formed by a conventional deposition process, including but not limited to, CVD, PVD, ALD, molecular beam epitaxy (MBE), ion beam deposition, electron beam deposition, and laser assisted deposition. The gate dielectric layer that is formed may have a thickness ranging from 0.9 nm to 6 nm, with a thickness ranging from 1.0 nm to 3 nm being more typical. The gate dielectric layer may have an effective oxide thickness on the order of or less than 1 nm.

Remaining volumes of the gate cavities 40 are then filled with a gate electrode layer (not shown). The gate electrode layer can includes any conductive material, such as, for example, polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate electrode layer is comprised of titanium nitride and tungsten.

The gate electrode layer can be formed utilizing a conventional deposition process including, for example, CVD, plasma enhanced chemical vapor deposition (PECVD), evaporation, PVD, sputtering, chemical solution deposition and ALD. When silicon-containing materials are used as the gate electrode layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material. The portion of the gate electrode layer formed above the top surface of the ILD layer 36 can be removed, for example, by CMP. The portion of the gate dielectric layer that is formed above the top surface of the ILD layer 36 may also be subsequently removed. In some embodiments and as illustrated, the remaining portions of the gate electrode layer and the remaining portions of the gate dielectric layer may be recessed utilizing a dry etch or a wet chemical etch to provide a void (not shown) in each of the gate cavities 40. The recessed portions of the gate electrode layer constitute gate electrode 44, and the recessed portions of the gate dielectric layer constitute gate dielectric 42.

A gate cap material is then deposited over the gate dielectric 42 and the gate electrode 44 in the gate cavities 40 and planarized to fill voids that are formed after recessing the remaining portions of the gate electrode layer and the remaining portions of the gate dielectric layer. Exemplary gate cap materials include, but are not limited to, silicon nitride, silicon carbide nitride (SiCN), or silicon boron carbonitride (SiBCN). The deposition of the gate cap material can be performed utilizing a conventional deposition process such as, for example, CVD or PECVD. Following the deposition of the gate cap material, the deposited gate cap material can be subsequently planarized, for example, by CMP using the top surface of the ILD layer 36 as an etch stop to provide the gate cap 46. In some embodiments, the gate cap 46 may be omitted.

Figure 6A:
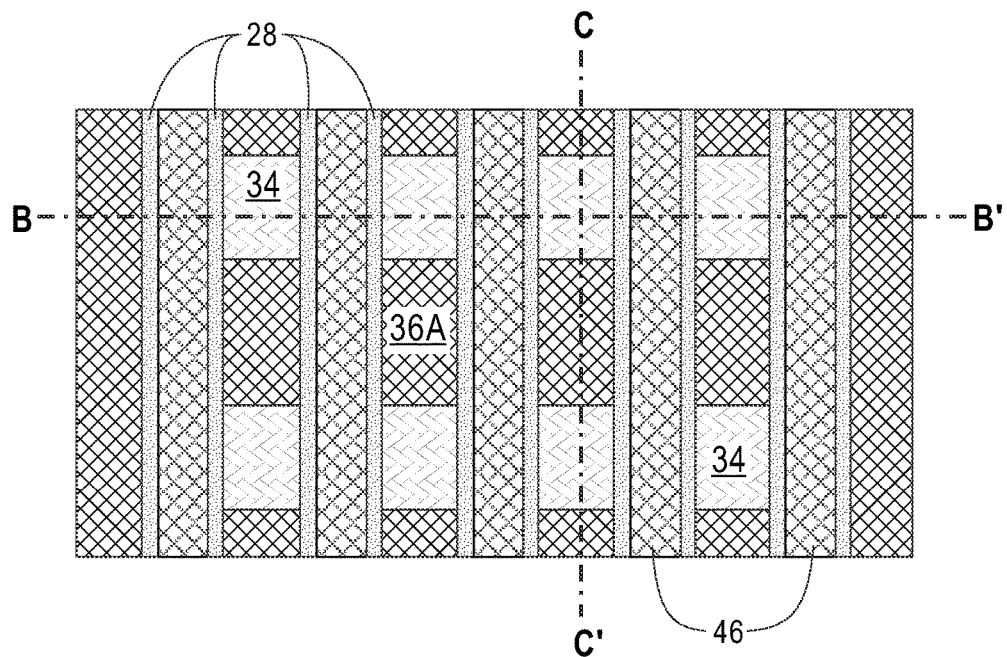
FIG. 6A is a top-down view of the exemplary semiconductor structure of FIG. 6A after recessing the ILD layer to expose the raised source/drain regions.
Figure 6B:
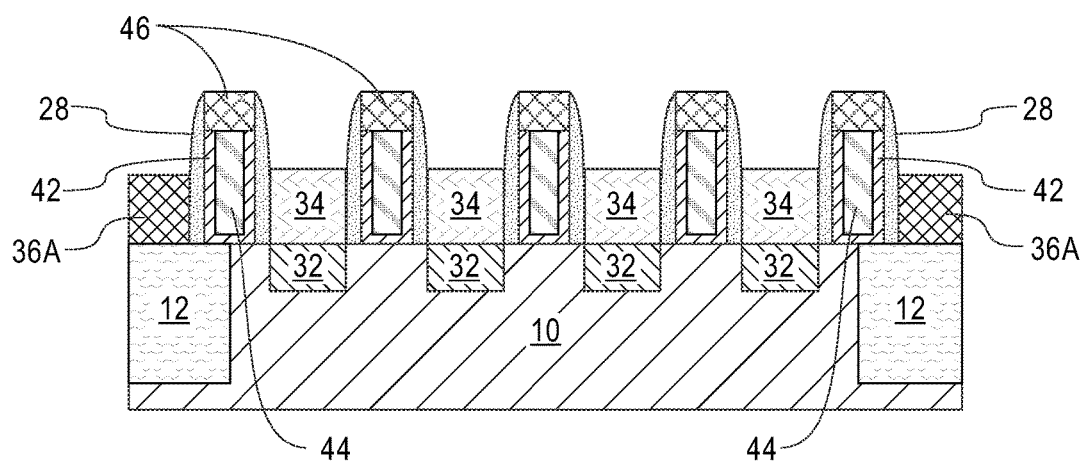
FIG. 6B is a cross-sectional view of the exemplary semiconductor structure of FIG. 6A along line B-B'.
Figure 6C:
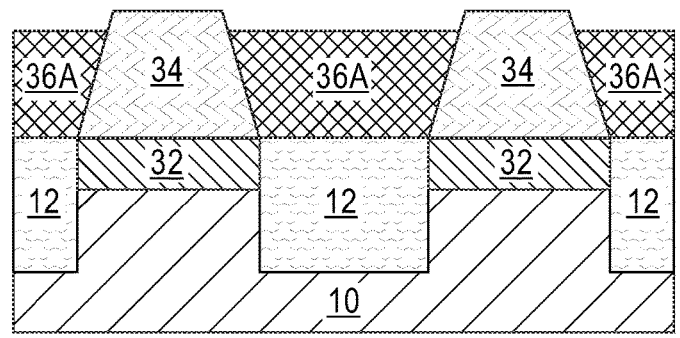
FIG. 6C is a cross-sectional view of the exemplary semiconductor structure of FIG. 6A along line C-C'.

Referring to FIGS. 6A-6C, the ILD layer 36 is recessed to expose the raised semiconductor material regions 34 utilizing an etch back process. The etch back process can be a dry etch such as, for example, RIE, or a wet chemical etch which may employ an aqueous solution containing hydrofluoric acid (HF). The etch back process removes an upper portion of the ILD layer 36 selectively to the gate spacer 28, the gate cap 46, and raised semiconductor material regions 34. The remaining portions of the ILD layer 36 is herein referred to as ILD layer portions 36A.

Figure 7A:
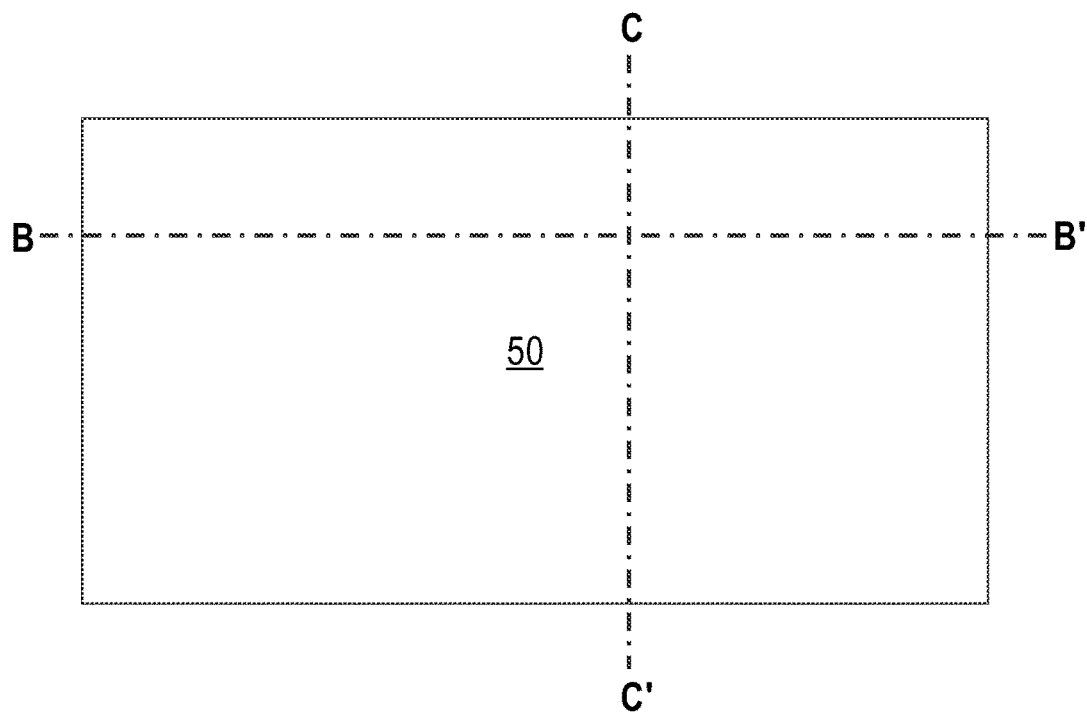
FIG. 7A is a top-down view of the exemplary semiconductor structure of FIG. 6A after forming a metal layer above the raised source/drain regions and the functional gate structures.
Figure 7B:
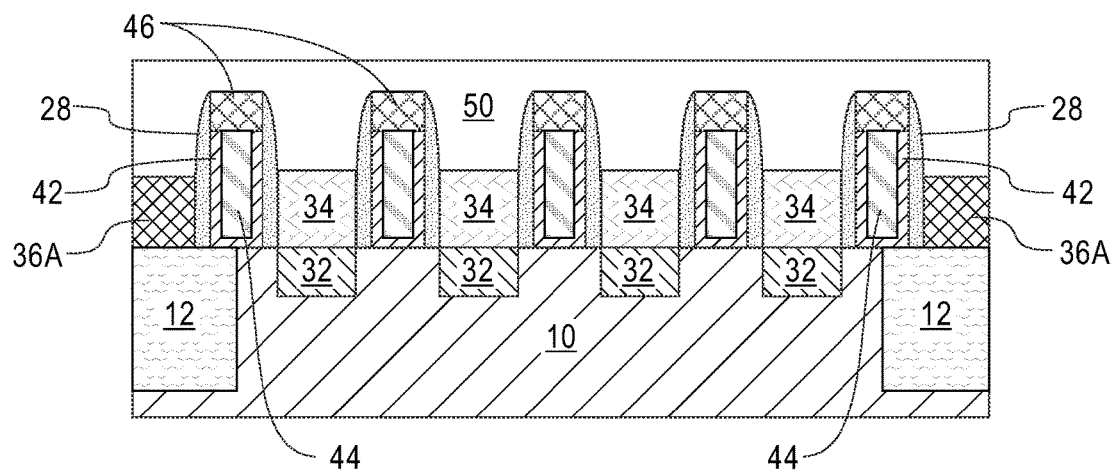
FIG. 7B is a cross-sectional view of the exemplary semiconductor structure of FIG. 7A along line B-B'.
Figure 7C:
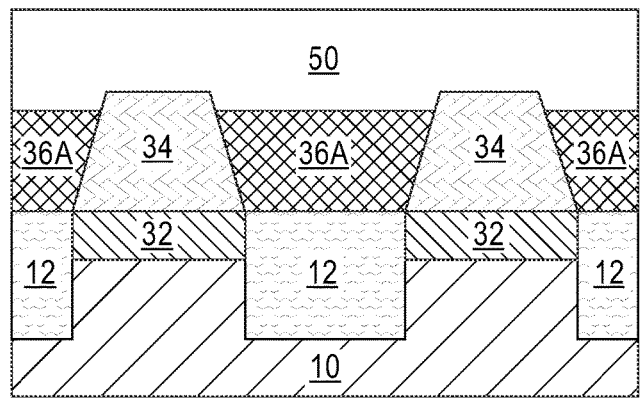
FIG. 7C is a cross-sectional view of the exemplary semiconductor structure of FIG. 7A along line C-C'.

Referring to FIGS. 7A-7C, a metal layer 50 is formed over the semiconductor substrate 8 to cover the functional gate structures (42, 44, 46), the gate spacer 28, the raised semiconductor material regions 34 and the ILD layer portions 36A. The metal layer 50 may include any metal that can form a metal semiconductor alloy having a large volume expansion upon reacted with the semiconductor material in the raised semiconductor material regions 34. The metal semiconductor alloy typically expands at least 50% in volume compared with the volume of the reacted semiconductor material in the raised semiconductor material regions 34. Exemplary metals that can be employed in the metal layer 50 include, but are not limited to, platinum, palladium, or lanthanum. The metal layer 50 may be deposited using physical deposition methods, such as plating and sputtering. The thickness of the metal layer 50 can be selected so that an entirety of the top surface of the metal layer 50 is formed above the topmost surfaces of the functional gate structures (42, 44, 46), i.e., the top surfaces of the gate cap 46.

Figure 8A:
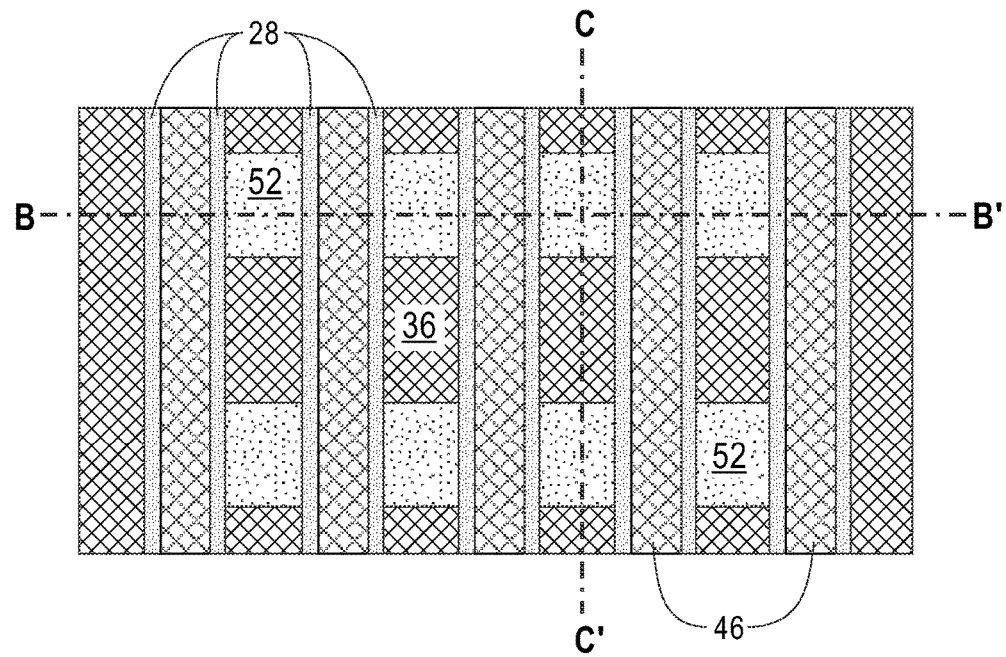
FIG. 8A is a top-down view of the exemplary semiconductor structure of FIG. 7A after forming metal semiconductor alloy regions over the raised source/drain regions and removing any unreacted metal layer portion.
Figure 8B:
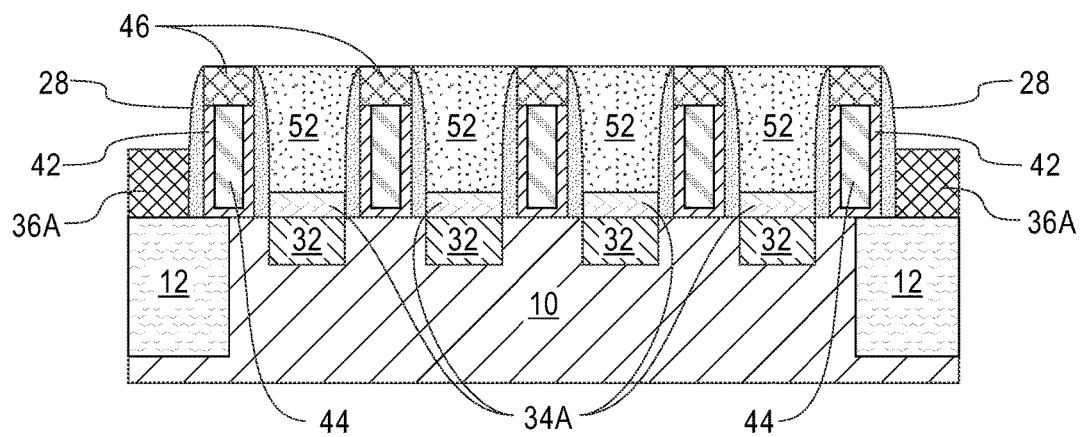
FIG. 8B is a cross-sectional view of the exemplary semiconductor structure of FIG. 8A along line B-B'.
Figure 8C:
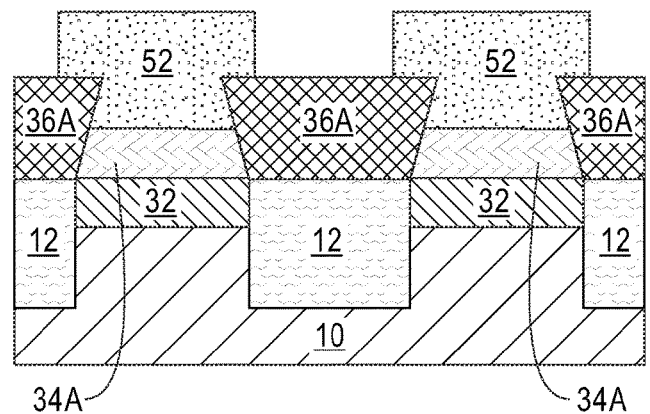
FIG. 8C is a cross-sectional view of the exemplary semiconductor structure of FIG. 8A along line C-C'.

Referring to FIGS. 8A-8C, an anneal is performed to form metal semiconductor alloy regions 52 on raised source/drain regions 36A. During the anneal, the metal in the metal layer 50 diffuses and reacts with the semiconductor material contained in the underlying raised semiconductor material regions 34, forming a metal semiconductor alloy including a metal silicide or metal germicide. In one embodiment, each of the metal semiconductor alloy regions 52 comprises a silicide of platinum, palladium, and lanthanum. The metal semiconductor alloy regions 52 that are formed do not extend through the entire thickness of the raised semiconductor material regions 34. Therefore, underlying the metal semiconductor alloy regions 52 are portions of unreacted raised semiconductor material regions 34. The portions of unreacted raised semiconductor material regions 34 are herein refer to as raised source/drain regions 34A. Due to the volume expansion associated with the anneal, top surfaces of the metal semiconductor alloy regions 52 are raised from the top surfaces of the raised semiconductor material regions 34 prior to the anneal. The magnitude of the volume expansion of the metal semiconductor alloy is determined by the type of metal used. For example, platinum silicide exhibits 50% volume expansion to the volume of Si reactant, palladium silicide exhibits 110% volume expansion to the volume of Si reactant, while lanthanum silicide exhibits 300% volume expansion to a volume of Si reactant. The metal semiconductor alloy regions 52 that are formed are raised up to a height substantially the same as that of the functional gate structures (42, 44, 46) and completely fill spaces between the functional gate structures (42, 44, 46). In one embodiment, the metal semiconductor alloy regions 52 can have top surfaces substantially coplanar with the topmost surfaces of the functional gate structures (42, 44, 46). The unreacted portion of the metal layer 50 is subsequently removed, for example, by a wet etch to expose the gate spacer 28, the gate cap 46, the ILD layer portions 36A and the metal semiconductor alloy regions 52.

Following silicide formation, gate contact structures and source/drain contact structures can be formed using conventional back end of the line (BEOL) processing.

Figure 9A:
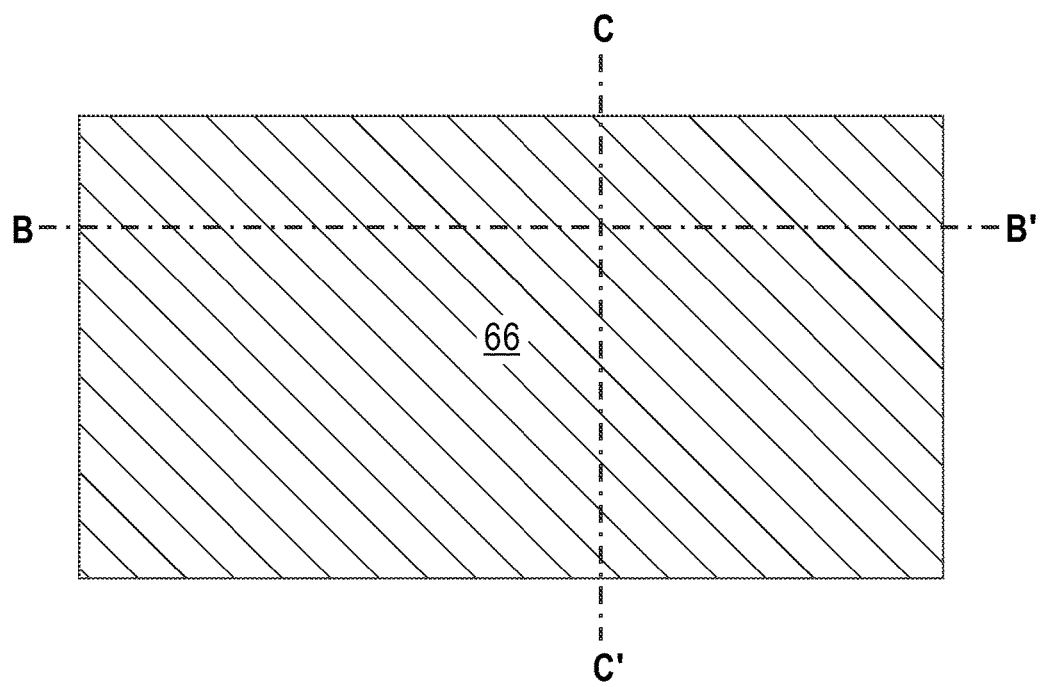
FIG. 9A is a top-down view of the exemplary semiconductor structure of FIG. 8A after forming a first contact level dielectric above the functional gate structures and an etch stop layer over the first contact level dielectric and a second contact level dielectric over the etch stop layer.
Figure 9B:
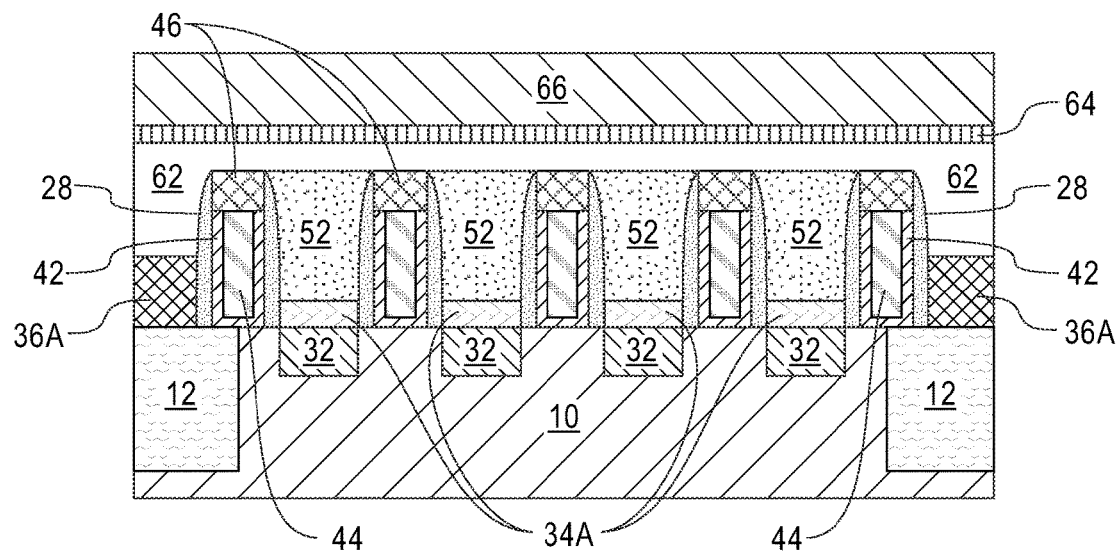
FIG. 9B is a cross-sectional view of the exemplary semiconductor structure of FIG. 9A along line B-B'.
Figure 9C:
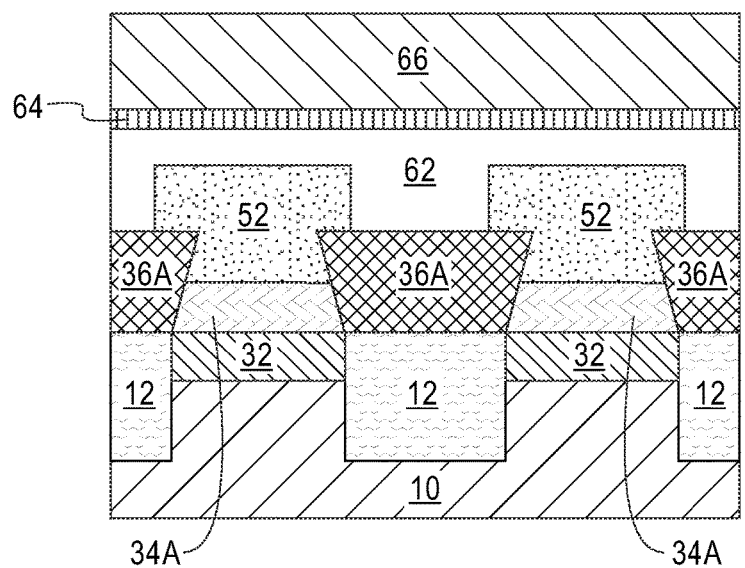
FIG. 9C is a cross-sectional view of the exemplary semiconductor structure of FIG. 9A along line C-C'.

Referring to FIGS. 9A-9C, a first contact level dielectric layer 62 is deposited directly on exposed surfaces of the ILD layer portions 36A, the functional gate structures (42, 44, 46), the gate spacer 28 and the metal semiconductor alloy regions 52. The first contact level dielectric layer 62 can include a dielectric material such as undoped silicon oxide, doped silicon oxide, porous or non-porous organosilicate glass, porous or non-porous nitrogen-doped organosilicate glass, or a combination thereof. In some embodiments, the first contact level dielectric layer 62 may include a same dielectric material as the ILD layer 36. In other embodiments, the first contact level dielectric layer 62 may include a different dielectric material from that used in providing the ILD layer 36. The first contact level dielectric layer 62 can be formed by CVD, PVD or spin coating. If the first contact level dielectric layer 62 is not self-planarizing, the top surface of the first contact level dielectric layer 62 can be planarized, for example, by chemical mechanical planarization (CMP). The planarized top surface of the first contact level dielectric layer 62 is located above the topmost surfaces of the functional gate structures (42, 44, 46), i.e., the top surfaces of the gate cap 46.

An etch stop layer 64 is then deposited over the first contact level dielectric layer 62 utilizing a conventional deposition process such as, for example, CVD, PECVD, chemical solution deposition, or evaporation. The etch stop layer 64 is typically composed of a dielectric nitride such as, for example, silicon nitride, silicon oxynitride, silicon boron nitride or silicon carbon oxynitride. The thickness of the etch stop layer 64 can be from 5 nm to 30 nm, although lesser and greater thicknesses can be employed. In some embodiments of the present application, the etch stop layer 64 is optional and can be omitted.

Next, a second contact level dielectric layer 66 is deposited over the etch stop layer 64. The second contact level dielectric layer 66 includes a dielectric material that is different, in terms of composition, from the dielectric material of the etch stop layer 66. In one embodiment, when the etch stop layer 64 includes silicon nitride, the second contact level dielectric layer 66 may include silicon oxide. In some embodiments, the second contact level dielectric layer 66 may be composed of a same dielectric material as that used in providing the first contact level dielectric layer 62. In other embodiments, the second contact level dielectric layer 66 may be composed of a different dielectric material as that used in providing the first contact level dielectric layer 62. The thickness of the second contact level dielectric layer 66 may be from 20 nm to 100 nm, although lesser and greater thicknesses. In some embodiments of the present application, the second contact level dielectric layer 66 is optional and can be omitted.

Figure 10A:
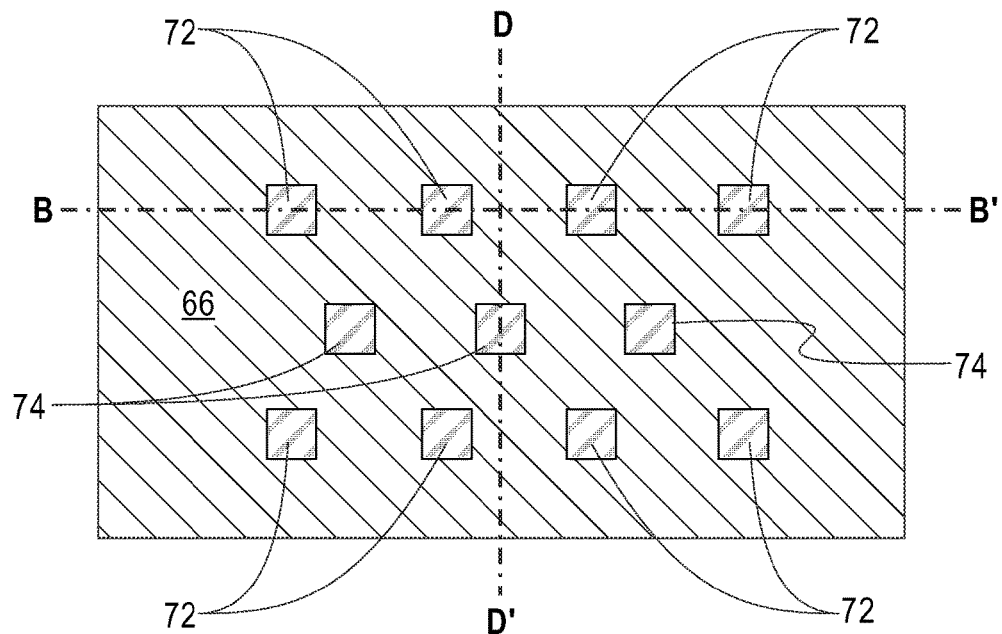
FIG. 10A is a top-down view of the exemplary semiconductor structure of FIG. 9A after forming source/drain contact structures and gate contact structures.
Figure 10B:
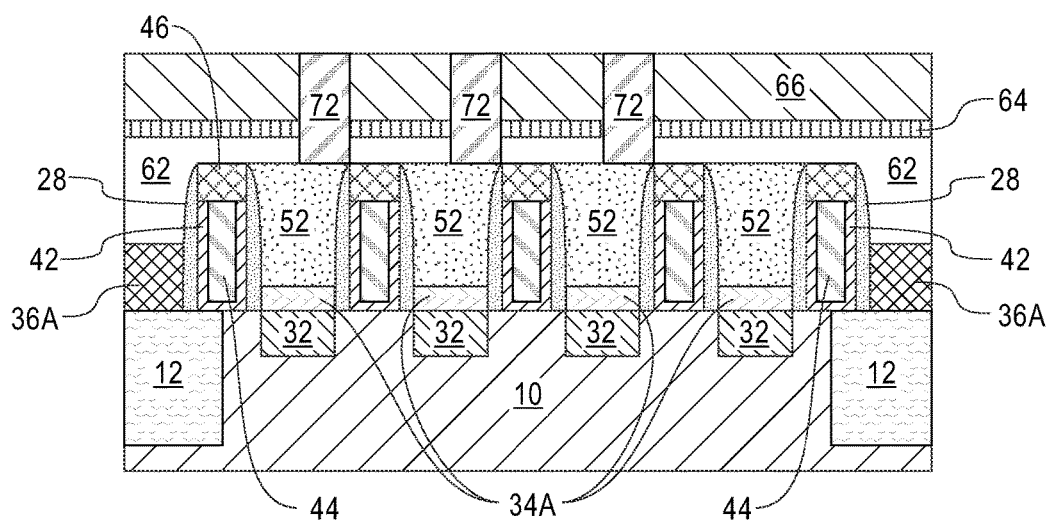
FIG. 10B is a cross-sectional view of the exemplary semiconductor structure of FIG. 9A along line B-B'.
Figure 10C:
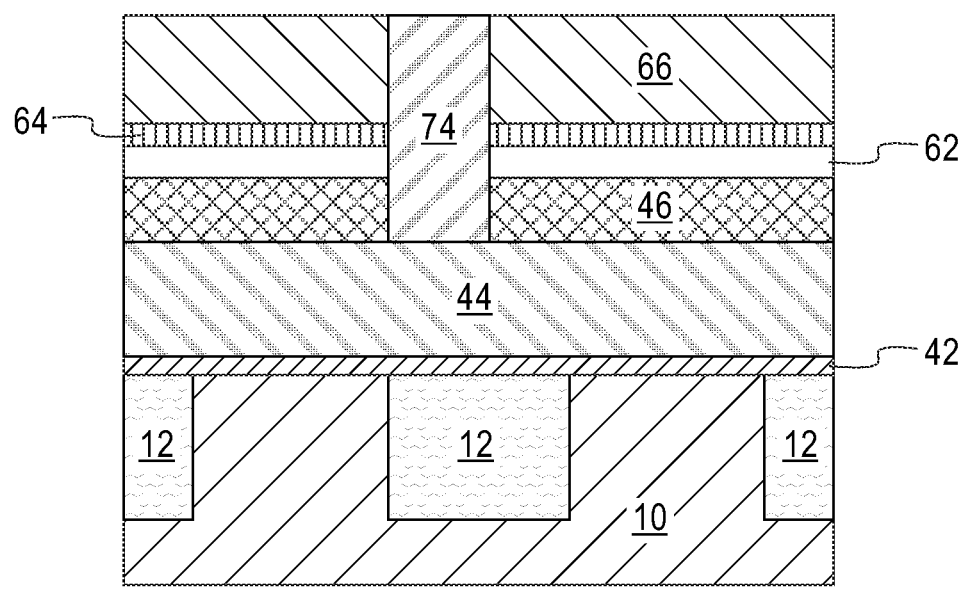
FIG. 10C is a cross-sectional view of the exemplary semiconductor structure of FIG. 9A along line D-D'.

Referring to FIGS. 10A-10C, contact via holes (not shown) including source/drain contact via holes and gate contact via holes are formed within first contact level dielectric layer 62, the etch stop layer 64 and the second contact level dielectric layer 66 using conventional photolithography and etching. The source/drain contact via holes are formed through the second contact level dielectric layer 66, the etch stop layer 64 and an upper portion of the first contact level dielectric layer 62 to expose portions of metal semiconductor alloy regions 52. In one embodiment of the present application, the source/drain contact via holes also expose portions of the gate spacer 28, thus are self-aligned. The gate contact via holes are formed through the second contact level dielectric layer 66, the etch stop layer 64, an upper portion of the first contact level dielectric layer 62 and the gate cap 46 to expose portions of the gate electrode 44. Source/drain contact structures 72 to the metal semiconductor alloy regions 52 and gate contact structures 74 to the gate electrode 44 are formed by depositing a conductive metal into the contact via holes using a conventional deposition process, such as for example, CVD, PVD, ALD, or plating. Exemplary conductive metals can be employed include, but are not limited to, Cu, Al, W, Ti, Ta or their alloys. Excess portions of the conductive material above the second contact level dielectric layer 66, can be subsequently removed, for example, by a recess etch or CMP. In the present application, since top surfaces of the metal semiconductor alloy regions 52 are substantially coplanar with the topmost surfaces of the functional gate structures (42, 44, 46), no lithographic patterning and etching between adjacent functional gate structures are needed in order to form source/drain contact structures.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a plurality of functional gate structures located over at least one active region of a substrate, each of the plurality of functional gate structures comprises a stack of a gate dielectric, a gate electrode, and a gate cap;
    a plurality of planar source/drain regions, each of the plurality of planar source/drain regions positioned in a portion of the at least one active region located between adjacent functional gate structures of the plurality of functional gate structures;
    a plurality of raised source/drain regions, each of the plurality of raised source/drain regions overlying a corresponding planar source/drain region of the plurality of planar source/drain regions and having a top surface located below a top surface of the gate electrode;
    a plurality of metal semiconductor alloy regions, each of the plurality of metal semiconductor alloy regions overlying a corresponding raised source/drain region of the plurality of raised source/drain regions and having a top surface substantially coplanar with topmost surfaces of the plurality of functional gate structures; and
    interlevel dielectric (ILD) layer portions located on the substrate and laterally surrounding the plurality of raised source/drain regions and lower portions of the plurality of metal semiconductor alloy regions, wherein top surfaces of the ILD layer portions are located below the top surface of each of the plurality of metal semiconductor alloy regions.

2. The semiconductor structure of claim 1, wherein the plurality of raise source/drain regions comprises a silicon-containing semiconductor material or a germanium-containing semiconductor material.

3. The semiconductor structure of claim 1, wherein the plurality of metal semiconductor alloy regions comprises a metal silicide or a metal germicide.

4. The semiconductor structure of claim 3, wherein the metal silicide comprises platinum silicide, palladium silicide, or lanthanum silicide, and wherein the metal germicide comprises platinum germicide, palladium germicide, or lanthanum germicide.

5. The semiconductor structure of claim 1, further comprising a plurality of source/drain contact structures extending through at least one contact level dielectric layer and in contact with the plurality of metal semiconductor alloy regions, and a plurality of gate contact structures extending through the at least one contact level dielectric layer and the gate cap in each of the plurality of functional gate structures and in contact with the gate electrode in each of the plurality of functional gate structures, wherein a bottommost surface of the at least one contact level dielectric layer is in contact with top surfaces of the ILD layer portions.

6. The semiconductor structure of claim 1, wherein the ILD layer portions comprise a doped silicate glass, an undoped silicate glass, an organosilicate glass, a porous dielectric material, or amorphous carbon.

7. The semiconductor structure of claim 5, wherein the at least one contact level dielectric layer comprises, from bottom to top, a first contact level dielectric layer, an etch stop layer, and a second contact level dielectric layer.

8. The semiconductor structure of claim 7, wherein each of the first contact level dielectric layer and the second contact level dielectric layer comprises silicon oxide, and the etch stop layer comprises silicon nitride.

9. The semiconductor structure of claim 5, wherein the at least one contact level dielectric layer laterally surrounds upper portions of the plurality of metal semiconductor alloy regions.

10. The semiconductor structure of claim 1, wherein the plurality of raised source/drain regions laterally surrounds lower portions of the plurality of the functional gate structure.

11. The semiconductor structure of claim 1, further comprising a gate spacer present on each sidewall of the plurality of functional gate structures.

* * * * *